(12) United States Patent
Amou et al.

(10) Patent No.: US 8,097,545 B2
(45) Date of Patent: Jan. 17, 2012

(54) PHASE-SEPARATION-CONTROLLED POLYBUTADIENE RESIN COMPOSITION AND PRINTED WIRING BOARD USING THE RESIN COMPOSITION

(75) Inventors: Satoru Amou, Hitachi (JP); Haruo Akahoshi, Hitachi (JP); Hiroshi Shimizu, Chikusei (JP); Akinori Hanawa, Shimotsuma (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 1120 days.

(21) Appl. No.: 11/867,091

(22) Filed: Oct. 4, 2007

(65) Prior Publication Data

US 2008/0090478 A1    Apr. 17, 2008

(30) Foreign Application Priority Data

Oct. 6, 2006    (JP) ................. 2006-275430

(51) Int. Cl.
  *B32B 27/04* (2006.01)
  *B32B 27/00* (2006.01)
(52) U.S. Cl. .............. 442/149; 428/476.9; 428/901
(58) Field of Classification Search .............. 442/104, 442/149; 428/476.9
See application file for complete search history.

(56) References Cited

U.S. PATENT DOCUMENTS

| | | |
|---|---|---|
| 3,939,133 A | 2/1976 | Roodvoets |
| 5,714,545 A | 2/1998 | Lee et al. |
| 2005/0064159 A1 | 3/2005 | Amou et al. |

FOREIGN PATENT DOCUMENTS

| | | |
|---|---|---|
| JP | 47-51952 | 12/1972 |
| JP | 48-14428 | 5/1973 |
| JP | 57-177025 A | 10/1982 |
| JP | 58-21925 | 5/1983 |
| JP | 58-21926 | 5/1983 |
| JP | 2005-089691 | 4/2005 |

OTHER PUBLICATIONS

Korean Official Action dated Aug. 28, 2008, for Application No. 10-2007-0099686.
Taiwanese Official Action dated Oct. 21, 2011, for Application No. 096136944.

*Primary Examiner* — Lynda Salvatore
(74) *Attorney, Agent, or Firm* — Antonelli, Terry, Stout & Kraus, LLP.

(57) ABSTRACT

It is an objective of this invention to obtain: a composition superior in processability, dielectric properties, heat resistance, and adhesiveness by controlling phase separation of a 1,2-polybutadiene resin composition without deterioration of dielectric properties exhibited in high-frequency regions; and a multilayer printed wiring board using the same.

This invention relates to a polybutadiene resin composition, comprising: a crosslinking component (A) comprising repeating units represented by the following formula (1) and having a number average molecular weight of 1000 to 20000; a radical polymerization initiator (B), the one-minute half-life temperature of which is 80° C. to 140° C.; and a radical polymerization initiator (C), the one-minute half-life temperature of which is 170° C. to 230° C.; wherein 3 to 10 parts by weight of the component (B) and 5 to 15 parts by weight of the component (C) are contained relative to 100 parts by weight of the component (A). The invention also relates to a prepreg, a laminate, and a printed wiring board, which are produced using the same.

11 Claims, 1 Drawing Sheet

PHASE-SEPARATION-CONTROLLED POLYBUTADIENE RESIN COMPOSITION AND PRINTED WIRING BOARD USING THE RESIN COMPOSITION

BACKGROUND OF THE INVENTION

1. Field of the Invention

The present invention relates to a phase-separation-controlled polybutadiene resin composition and a printed wiring board using the same for an insulating layer.

2. Background Art

In recent years, GHz bands have been used for signal bands of telecommunication devices such as PHS and mobile phones and for computer CPU clock time, resulting in the development of higher frequencies. Electrical signal transmission loss is expressed as the sum of dielectric loss, conductor loss, and radiation loss. The higher the electrical signal frequency, the greater the levels of dielectric loss, conductor loss, and radiation loss. Transmission loss causes electrical signal attenuation, resulting in loss of signal reliability. Thus, in the cases of wiring boards on which high-frequency signals are handled, it is necessary to devise a means of suppressing the increases in dielectric loss, conductor loss, and radiation loss. Dielectric loss is proportional to the product of the square root of the relative dielectric constant of the insulating material that is formed into a circuit, the dielectric loss tangent, and the frequency of the signal used. Therefore, it is possible to suppress the increase in dielectric loss by selecting, as an insulating material, a material having a low relative dielectric constant and a small dielectric loss tangent. As such insulating material, thermosetting polybutadiene having a structure that does not contain heteroatoms has been under examination for a long time. JP Patent Publication (Kokoku) No. 47-51952 B (1972) and JP Patent Publication (Kokoku) No. 48-14428 B (1973) each disclose a polybutadiene resin composition comprising a low-molecular-weight polybutadiene comprising 1,2-butadiene units (80 wt % or more) and having a number average molecular weight of 1000 to 20000, to which a vinyl monomer, a silane coupling agent, a filler, a curing accelerator, and a pigment are added according to need. Further, the above references each disclose a laminate produced by allowing a strengthening material such as glass fiber to be impregnated with such polybutadiene resin composition and carrying out heating and pressurization in the presence of organic peroxide. In addition, JP Patent Publication (Kokoku) No. 58-21925 B (1983) and JP Patent Publication (Kokoku) No. 58-21926 B (1983) each disclose a polybutadiene resin composition comprising, as a crosslinking component, a high-molecular-weight polybutadiene polymer comprising 1,2-butadiene units (50% or more) and having a number average molecular weight of 100000 to 200000. Such polybutadiene resin compositions were found to have the effect of imparting good tack-free properties to prepregs.

SUMMARY OF THE INVENTION

The aforementioned polybutadiene resin compositions essentially have the following problems. Firstly, a polybutadiene resin composition comprising, as a crosslinking component, low-molecular-weight polybutadiene has poor tack-free properties. A prepreg comprising such resin composition has adhesive properties, making such prepreg inferior in terms of preservation and handleability. Secondly, high-molecular-weight polybutadiene is solid at room temperature, and thus it is excellent in handleability. However, the viscosity of a highly concentrated varnish containing such polybutadiene is very high. When the varnish viscosity is adjusted to a level appropriate for coating operations (≦500 cP), a dilute varnish (approximately 10 wt %) is obtained. In such case, it is necessary to carry out multiple coating and drying operations so that an adjusted amount of such polybutadiene impregnates a board. Thirdly, since polybutadiene has low polarity, it is less compatible with other materials such as fillers, flame retardants, and blend polymers. Therefore, upon press processing, phase separation of polybutadiene (serving as a crosslinking component) occurs, resulting in extrusion of polybutadiene from a laminate system, which is problematic. The occurrence of phase separation results not only in poor laminate appearance but also in insufficient curing due to extrusion of polybutadiene (serving as a crosslinking component) outside the system and a subsequent decrease in solvent resistance.

It is an objective of the present invention to provide a polybutadiene resin composition with which decreased varnish viscosity upon preparation of a highly concentrated varnish and tack-free properties are achieved and in which phase separation of polybutadiene (serving as a crosslinking component) from other composite materials is controlled, and a printed wiring board using such resin composition.

(1) A polybutadiene resin composition, comprising: a crosslinking component (A) comprising repeating units represented by the following formula (1) and having a number average molecular weight of 1000 to 20000; a radical polymerization initiator (B), the one-minute half-life temperature of which is 80° C. to 140° C.; and a radical polymerization initiator (C), the one-minute half-life temperature of which is 170° C. to 230° C.; wherein 3 to 10 parts by weight of the component (B) and 5 to 15 parts by weight of the component (C) are contained relative to 100 parts by weight of the component (A):

formula (1)

(2) The polybutadiene resin composition according to (1), wherein the first exothermic peak is at 80° C. to 140° C. and the second exothermic peak is at 170° C. to 230° C. during thermal polymerization.

(3) The polybutadiene resin composition according to (1) or (2), wherein the component (C) is 2,5-dimethyl-2,5-bis(t-butylperoxy)hexyne-3.

(4) The polybutadiene resin composition according to any one of (1) to (3), further comprising a styrene-butadiene block copolymer or a hydrogenated styrene-butadiene block copolymer (D), a flame retardant (E), and inorganic filler (F).

(5) The polybutadiene resin composition according to (4), wherein the content of repeating units represented by formula (1) in the component (A) is 90 wt % or more, the styrene residue content in the component (D) is 10 to 30 wt %, the component (E) is a compound represented by formula (2) or (3), and the component (F) is a silicon oxide filler subjected to surface treatment with a coupling agent capable of reacting with vinyl groups:

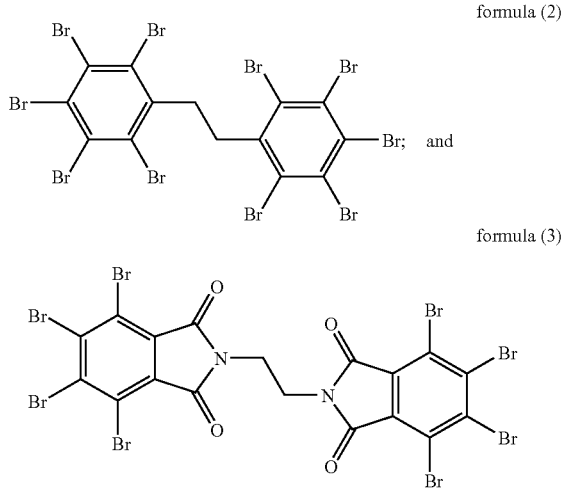

formula (2)

formula (3)

(6) The polybutadiene composition according to (4) or (5), wherein 15 to 100 parts by weight of the component (D), 50 to 100 parts by weight of the component (E), and 80 to 200 parts by weight of the component (F) are contained relative to 100 parts by weight of the component (A).

(7) The polybutadiene resin composition according to any one of (1) to (6), which is a polybutadiene resin composition obtained by terminating a thermal polymerization reaction initiated by the component (B).

(8) A method for producing a prepreg, comprising allowing a cloth or nonwoven cloth made of organic or inorganic material to be impregnated with the polybutadiene resin composition according to any one of (1) to (7) and then carrying out drying by heat at a temperature in the range of the first exothermic peak temperature of thermal polymerization of the polybutadiene resin composition ±10° C.

(9) A prepreg, which is obtained by allowing a cloth or nonwoven cloth made of organic or inorganic material to be impregnated with the polybutadiene resin composition according to any one of (1) to (7) and then carrying out drying by heat at a temperature in the range of the first exothermic peak temperature of thermal polymerization of the polybutadiene resin composition ±10° C.

(10) A laminate, which is produced by allowing conductive foil to overlap the prepreg according to (9), curing the prepreg by pressurization and heating, and allowing the cured prepreg to bond with conductive foil.

(11) A multilayer printed wiring board, which is produced by allowing a plurality of printed wiring boards, which are obtained by wiring processing of conductive foil disposed on the surface of the laminate according to (10), to be subjected to laminate bonding via the prepreg according to (9) and then carrying out interlayer wire formation.

Effects of the Invention

According to the present invention, a resin composition comprising, as a crosslinking component, 1,2-polybutadiene used for general purposes can be easily formed into a varnish and a prepreg. The prepreg of the present invention can be easily subjected to molding processing, upon which phase separation and extrusion of the crosslinking component do not occur. A laminate and a multilayer printed wiring board made of the prepreg of the present invention have a small relative dielectric constant, a small dielectric loss tangent, and high levels of adhesivity to copper foil and heat resistance. Thus, they are preferably used as board materials that constitute a high-frequency apparatus.

Figure 1:
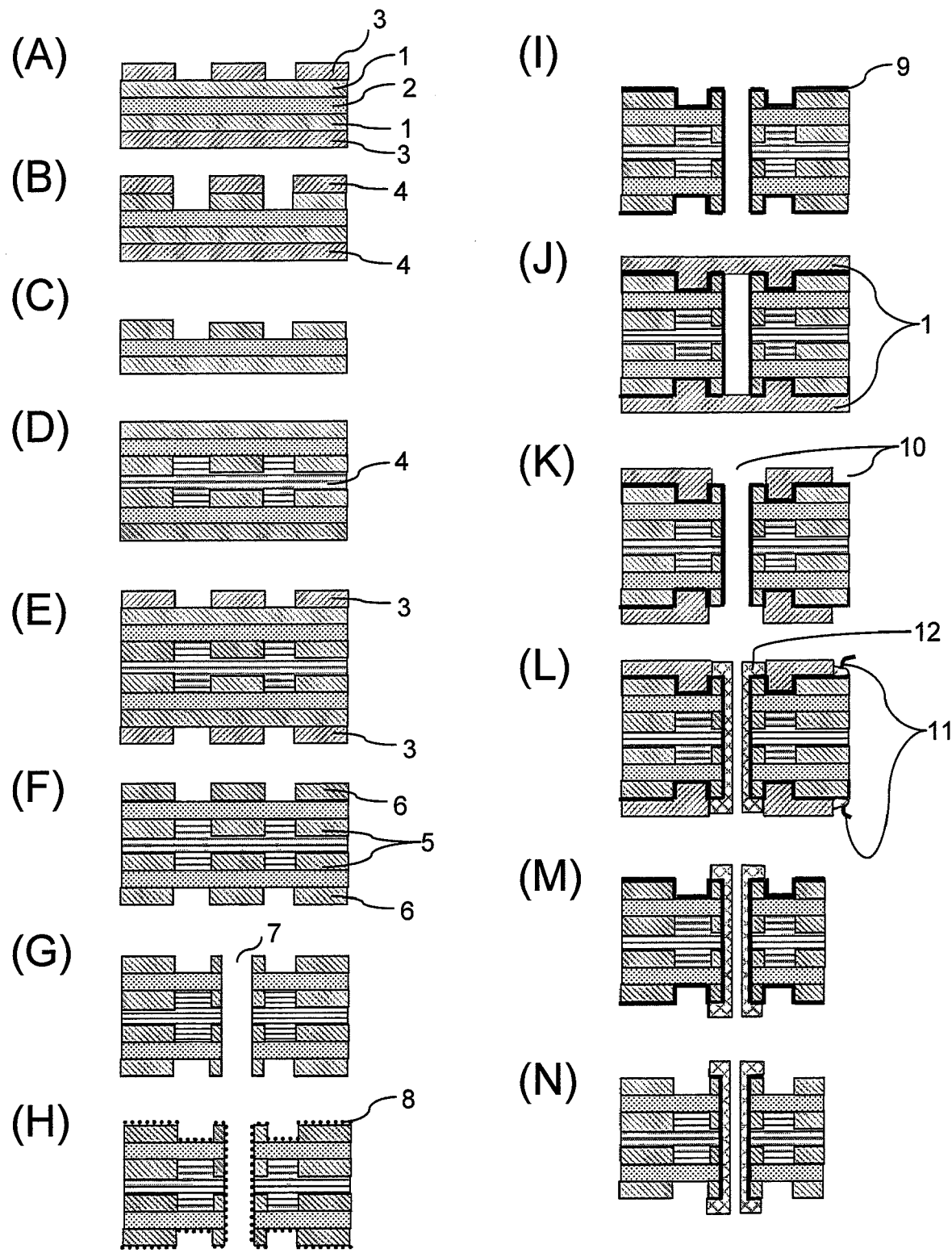
FIG. 1 shows a typical pattern of processes for preparing a multilayer wiring board.

The numerals in the figures have the following meanings.

1 . . . copper foil
2 . . . resin board
3 . . . photoresist
4 . . . prepreg
5 . . . inner layer wire
6 . . . exterior wire
7 . . . through hole
8 . . . plating catalyst
9 . . . seed layer
10 . . . opening
11 . . . electrode
12 . . . tinned copper

DESCRIPTION OF THE PREFERRED EMBODIMENTS

A first embodiment of the present invention is a polybutadiene resin composition, comprising: a crosslinking component (A) comprising repeating units represented by the following formula (1) and having a number average molecular weight of 1000 to 20000; a radical polymerization initiator (B), the one-minute half-life temperature of which is 80° C. to 140° C.; and a radical polymerization initiator (C), the one-minute half-life temperature of which is 170° C. to 230° C.; wherein 3 to 10 parts by weight of the component (B) and 5 to 15 parts by weight of the component (C) are contained relative to 100 parts by weight of the component (A).

A second embodiment of the present invention is a polybutadiene resin composition, wherein the first exothermic peak is at 80° C. to 140° C. and the second exothermic peak is at 170° C. to 230° C. during thermal polymerization.

Radical polymerizability (curability) of 1,2-polybutadiene was examined. Accordingly, it was found that the extent of curing of polybutadiene does not depend on curing time and/or temperature but depends on the amount of a radical polymerization initiator to be added. Based on the finding, it is considered that the improvement of tack-free properties and prevention of phase separation from other components can be achieved in the following manner. An adequate amount of a radical polymerization initiator is added to 1,2-polybutadiene, followed by heating upon preparation of a varnish or drying of a prepreg. This results in the progression of crosslinking of 1,2-polybutadiene and the obtaining of a polymer having a three-dimensional crosslinking structure.

A preferred example of a crosslinking component (A) used in the present invention is low-molecular-weight 1,2-polybutadiene having a number average molecular weight of 1000 to 20000 in view of the reduction in the viscosity of a highly concentrated varnish. In particular, in view of curability, 1,2-polybutadiene comprising 1,2-butadiene units (90 wt % or more) represented by formula (1) is preferable. Examples of repeating units that can be contained in the crosslinking component (A) include a cis-1,4-butadiene unit and a trans-1,4-butadiene unit, in addition to a 1,2-butadiene unit.

A radical polymerization initiator (B) is a component that induces a crosslinking reaction of the crosslinking component (A) at relatively low temperatures upon preparation of a varnish or hydration of a prepreg. Hereafter, such component (B) is referred to as a "low temperature initiator (B)." Such low temperature initiator (B) is required to cause radical generation at relatively low temperatures. Thus, a radical polymerization initiator, the one-minute half-life temperature of which is from 80° C. to 140° C., is preferably used. A preferred amount of the low temperature initiator (B) to be added is preferably 3 to 10 parts by weight relative to 100 parts by weight of the crosslinking component (A). When the amount is less than 3 parts by weight, phase separation and/or extrusion cannot be sufficiently controlled. When the amount is more than 10 parts by weight, the varnish viscosity increases and/or deterioration of fluid properties of a resin composition occurs upon press processing. Examples of a low temperature initiator (B) include isobutyl peroxide, α,α'-bis(neodecanoylperoxy) diisopropylbenzene, cumylperoxyneodecanoate, di-n-propylperoxydicarbonate, 1,1,3,3-tetramethylbutylperoxyneodecanoate, diisopropylperoxydicarbonate, 1-cyclohexyl-1-methylethylperoxyneodecanoate, di-2-ethoxyethylperoxydicarbonate, di(2-ethylhexylperoxy)dicarbonate, t-hexylperoxyneodecanoate, dimetoxybutylperoxydidecanoate, di(3-methyl-3-methoxybutylperoxy)dicarbonate, t-butylperoxyneodecanoate, t-hexylperoxypivalate, t-butylperoxypivalate, 3,5,5-trimethylhexanoylperoxide, octanoylperoxide, 1,1,3,3-tetramethylbutylperoxy-2-ethylhexanoate, 2,5-dimethyl-2,5-di(2-ethylhexanoylperoxy)hexane, 1-cyclohexyl-1-methylethylperoxy-2-ethylhexanoate, t-hexylperoxy-2-ethylhexanoate, t-butylperoxy-2-ethylhexanoate, m-toluoylperoxide, and t-butylperoxyisobutyrate. Further preferred examples of a low temperature initiator (B) superior in preservation stability at room temperature include benzoyl peroxide, lauroyl peroxide, stearoyl peroxide, and bis(4-t-butylcyclohexyl)peroxydicarbonate. The use of such low temperature initiator (B) superior in preservation stability at room temperature is preferable. This is because, in addition to the improvement of the preservation safety of a radical polymerization initiator, a degradation reaction is less likely to be caused during preservation so that polymerization initiation properties of such initiator are stable, resulting in ease of prevention of phase separation of resin material contained in a prepreg and ease of fluid property control. A particularly preferable example thereof is benzoyl peroxide, since the polymerization rate thereof is high due to the high active oxygen content.

A radical polymerization initiator (C) functions to promote curing of a prepreg upon press processing for production of a laminate or a multilayer printed wiring board. With the use of such initiator, heat resistance, solvent resistance, and the like of a laminate or a multilayer printed wiring board can be improved. Hereafter, a radical polymerization initiator (C) is referred to as a "high temperature initiator (C)." It is necessary for high temperature initiator (C) to cause radical generation at temperatures higher than the temperatures corresponding to the case of a low temperature initiator (B). Thus, a radical polymerization initiator, the one-minute half-life temperature of which is from 170° C. to 230° C., is preferably used. A preferred amount of the high temperature initiator (C) to be added is from 5 to 15 parts by weight relative to 100 parts by weight of the crosslinking component (A). When the amount is less than 5 parts by weight, insufficient curing might cause a decrease in solvent resistance. When the amount is more than 15 parts by weight, excessively advanced curing might result in insufficient peeling strength. Examples of a high temperature initiator (C) include α,α'-bis(t-butylperoxy)diisopropylbenzene, dicumyl peroxide, 2,5-dimethyl-2,5-di(t-butylperoxy)hexane, t-butylcumyl peroxide, di-t-butyl peroxide, 2,5-dimethyl-2,5-di(t-butylperoxy)hexyne-3, and t-butyltrimethylsilyl peroxide. 2,5-dimethyl-2,5-di(t-butylperoxy)hexyne-3 is particularly preferable because it does not cause significant deterioration of dielectric properties.

According to the present invention, in order to adjust physical properties, a styrene-butadiene block copolymer or a hydrogenated styrene-butadiene block copolymer (D), a flame retardant (E), and an inorganic filler (F) can be added to a polybutadiene resin composition.

A styrene-butadiene block copolymer or a hydrogenated styrene-butadiene block copolymer (D) has effects of improving tack-free properties of a prepreg without deteriorating dielectric properties of a printed wiring board system. The styrene residue content of a component (D) is preferably 10 to 30 wt %. With the use of a component (D) comprising styrene residues within the above scope, tack-free properties can be improved without a decrease in glass transition temperature. Meanwhile, when a component (D) with a styrene residue content of less than 10 wt % is used, the varnish viscosity increases, as in a case in which high-molecular-weight polybutadiene is added. When a component (D) with a styrene residue content of more than 30 wt % is used, micro-phase separation may occur upon curing so that the glass transition temperature might be reduced to around 100° C.

A flame retardant (E) is a component with which flame retardancy is imparted to a printed wiring board system. Particularly preferable examples of a flame retardant that can be used include a flame retardant comprising a compound represented by formula (2) or (3), which has a low dielectric loss tangent, a high degradation temperature, a high fusion temperature, and high flame-retardant effects. Preferably, the particle size of a flame retardant (E) is 0.2 to 3.0 μm. The use of such flame retardant results in the prevention of precipitation of a flame retardant upon preservation of a varnish and ease of redispersion of precipitates.

An inorganic filler (F) contributes to the reduction in thermal expansion of a printed wiring board system. Examples of a preferred filler species include silicon oxide having a low dielectric loss tangent. Further, it is preferable to carry out surface treatment on the filler surface with the use of a vinyl coupling agent for exhibition of effects of decreasing a dielectric loss tangent and effects of controlling phase separation of 1,2-polybutadiene in a printed wiring board system. Regarding the particle size of a component (F), the average particle size is preferably from 0.5 to 60 μm in view of productivity and attainment of insulation properties of the final product.

Preferable mixing ratios of individual composite materials are 15 to 100 parts by weight in the case of component (D), 50 to 100 parts by weight in the case of component (E), and 80 to 200 parts by weight in the case of component (F) relative to 100 parts by weight of a crosslinking component (A). It is preferable to adjust the ratios within the above ranges depending on desirable properties of the final product.

The polybutadiene resin composition of the present invention can be used as a prepreg after the completion of first thermal polymerization initiated by a low temperature initiator (B) upon preparation of a varnish or drying of a prepreg. Preferably, an organic solvent used to obtain a varnish is a good solvent for a crosslinking component (A) and a styrene-butadiene block copolymer. Examples thereof include THF, toluene, and cyclohexane. Based on the composition rate of the present invention, a varnish viscosity of ≦500 cP can be obtained at a solid content concentration of 30 to 50 wt %.

The time for drying of a prepreg is preferably a short period of time of 10 to 30 minutes in view of workability. Thus, the drying temperature is preferably a temperature in the range of the first exothermic peak temperature of a low temperature initiator (B) ±10° C. At such temperature, radical generation immediately takes place due to the presence of a low temperature initiator (B), resulting in progression of a crosslinking reaction in a short period of time. In addition, drying is preferably carried out under a nitrogen atmosphere or nitrogen stream in order to prevent radical deactivation. In a case in which a prepreg is dried in the air, it is preferable to complete a crosslinking reaction, which was initiated by a low temperature initiator (B), under nitrogen stream upon preparation of a varnish before the formation of the prepreg. Accordingly, excessive oxidation of a cured prepreg can be prevented so that deterioration of dielectric properties of a laminate and a multilayer printed wiring board can be prevented.

A different type of cloth or nonwoven cloth made of organic or inorganic material is impregnated with the polybutadiene resin composition of the present invention, followed by drying. The thus obtained prepreg is used. In particular, when cloth or nonwoven cloth made of inorganic material is used, it is preferable to modify the surface of such cloth or nonwoven cloth with a coupling agent so as to use such cloth, as with the case of the above inorganic filler. Examples of cloth or nonwoven cloth made of inorganic material include glass cloth and nonwoven glass cloth.

The prepreg of the present invention is allowed to overlap conductive foil such as electrolytic copper foil or rolled copper foil, followed by heat press processing. Thus, it is possible to prepare a laminate having a surface covered with a conductor layer. The prepreg of the present invention contains high-molecular-weight 1,2-polybutadiene formed by a crosslinking reaction initiated by a low temperature initiator (B). Thus, with the use of the prepreg of the present invention for production of a laminate, the occurrence of phase separation and extrusion of 1,2-polybutadiene outside a prepreg system upon press processing are prevented. In addition, in a case in which an inorganic filler (F) subjected to surface treatment with the use of a coupling agent and/or cloth or nonwoven cloth subjected to surface treatment with the use of a coupling agent is used upon preparation of a prepreg, appropriate covalent bonds are formed between 1,2-polybutadiene and the inorganic filler surface and/or the cloth or nonwoven cloth surface. Thus, it becomes possible to further enhance effects of controlling the occurrence of phase separation and extrusion of 1,2-polybutadiene outside the system upon press processing.

Temperature conditions upon heat press processing are not particularly limited as long as polybutadiene contained in a prepreg can be cured by a thermal polymerization reaction initiated by a high temperature initiator (C). Examples of such conditions include temperature conditions at 170° C. to 230° C. Pressure conditions upon heat press processing are not particularly limited as long as a cured prepreg is allowed to bond with conductive foil. Examples of such conditions include pressure conditions at 1 to 5 MPa.

Regarding preferable forms of conductive foil used for the laminate of the present invention, the thickness of conductive foil is preferably approximately 9 to 36 µm in view of processing accuracy upon etching and the like. Preferably, the surface roughness of the bonding face of conductive foil is 1 to 3 µm in view of reductions in conductor loss and radiation loss, such bonding face being located between conductive foil and the resin layer of a prepreg. The use of conductive foil having a small degree of surface roughness is preferable. This is because the reductions in conductor loss and radiation loss result in reduction in electrical signal loss so that excellent transmission characteristics of a multilayer printed wiring board made of resin having a low dielectric loss tangent do not deteriorate. According to the present invention, the surface of conductive foil having a small degree of surface roughness is subjected to surface modification with the use of a coupling agent, as with the case of the above inorganic filler. As a result, adhesivity between a resin layer of a prepreg and conductive foil can be improved. With the increase in adhesiveness of a conductor layer having a small degree of surface roughness, it becomes possible to prevent problems such as disconnection or peeling off of a conductor layer during production processes for multilayer printed wiring boards involving etching processing, multilayer formation, and the like described below.

Examples of the multilayer printed wiring board produced with the use of a prepreg and a laminate of the present invention will be described below. A conductor layer of the laminate of the present invention is subjected to wiring processing by a conventional etching method. A plurality of laminates subjected to wiring processing are laminated via the above prepreg and heat-pressed for multilayer formation. Thereafter, the multilayer printed wiring board is produced following through-hole or blind-via-hole formation by drilling or laser processing and interlayer wire formation by plating or with the use of conductive paste.

EXAMPLES

The present invention is hereafter described in greater detail with reference to the following Examples and Comparative examples, although the technical scope of the present invention is not limited thereto.

(1) Material

Crosslinking Component (A):
 Low-molecular-weight 1,2-polybutadiene (number average molecular weight ≈2600 to 3400, 1,2-butadiene unit content≧90 wt %, Nippon Soda Co., Ltd., B-3000)

Crosslinking Component Used in the Comparative Examples:
 High-molecular-weight 1,2-polybutadiene (RB830, number average molecular weight ≈170000, 1,2-butadiene unit content ≈90 wt %, JSR)

Low Temperature Initiator (B):
 Benzoyl peroxide (abbreviation: BPO) (purity ≈75 wt %, one-minute half-life temperature≈130° C., Aldrich Chemical Company, Inc.)

High Temperature Initiator (C):
 2,5-dimethyl-2,5-di(t-butylperoxy)hexyne-3 (abbreviation: 25B), (one-minute half-life temperature ≈196° C., purity ≧90%, NOF Corporation)

Styrene-Butadiene Block Copolymer (D):
 Hydrogenated styrene-butadiene block copolymer (H1031, styrene content: 30 wt %, Asahi Kasei Chemicals)
 Hydrogenated styrene-butadiene block copolymer (H1051, styrene content: 42 wt %, Asahi Kasei Chemicals)

Flame Retardant (E):
 1,2-bis(pentabromophenyl)ethane (flame retardant represented by formula (2)) (SAYTEX8010, average particle size: 1.5 µm, Albemarle Japan Corporation)

Inorganic Filler (F):
 Silicon oxide filler (SO25R, average particle size: 0.5 µm, Admatechs)

Coupling Agent:
 3-methacryloxypropyltrimethoxysilane (KBM503, Shin-Etsu Chemical Co., Ltd.)

Conductive Foil:
 Coupling-treated copper foil (thickness: 18 µm, mat surface roughness: (Rz) 2 µm, Nikko Materials Co., Ltd.)

Glass Cloth:

NE glass cloth (thickness: approximately 100 μm, Nitto Boseki Co., Ltd.)

(2) Coupling Treatment of a Filler

A silicon oxide filler was added to a methanol solution containing KBM503. The solution was agitated using a ball mill for 8 hours. Then, the filler was separated therefrom by filtration and dried at 120° C. for 4 hours. The coupling agent content of the inorganic filler was determined to be 0.8 wt %.

(3) Coupling Treatment of Glass Cloth

Glass cloth was immersed in a methanol solution containing KBM503. The solution was allowed to stand for 8 hours. Then, the glass cloth was removed therefrom and dried at 120° C. for 4 hours, followed by surface treatment. The coupling agent content of glass cloth was determined to be 0.2 wt %.

(4) Preparation of a Varnish

Predetermined amounts of the crosslinking component (A), the low temperature initiator (B), the high temperature initiator (C), the styrene-butadiene block copolymer (D), the flame retardant (E), and the inorganic filler (F) were dissolved and dispersed in toluene with the use of a ball mill such that a polybutadiene resin composition in the form of varnish was prepared.

(5) Method for Preparing a Cured Material (Resin Plate)

The above varnish was applied to PET film and dried under nitrogen stream at 140° C. for 30 minutes. Then, the varnish was removed therefrom and introduced into an iron-made spacer having a thickness of 1.5 mm, followed by pressurization and heating via vacuum pressing. As a result, a cured material was obtained. Curing conditions included pressurization to 2 MPa at room temperature, temperature increase at a constant rate (6° C./minute), and retention at 230° C. for 60 minutes.

(6) Method for Preparing a Prepreg

Glass cloth was immersed in the above varnish and pulled out therefrom at a constant rate and dried at room temperature for approximately 1 hour and then at 140° C. for 10 minutes during heating under nitrogen stream. The resin composition content relative to the weight of prepreg was determined to be 50 to 55 wt %.

(7) Method for Preparing a Laminate

A prepreg prepared as above was cut into pieces each having a size of 100×100 mm. Six prepreg pieces were allowed to overlap and then sandwiched by two sheets of copper foil (200×200 mm). Then, molding processing was carried out in vacuo under conditions including a molding pressure of 2 MPa, a temperature increase rate of 6° C./minute, a retention temperature at 230° C., and a retention time of 60 minutes. Thus, a laminate was prepared.

(8) Evaluation of Processability

Etching of copper foil on the laminate prepared as above was carried out. Then, the occurrence or nonoccurrence of phase separation of the crosslinking component (A) and the occurrence or nonoccurrence of extrusion were observed. In addition, as an index for fluid properties of a resin composition in its entirety, the fluidity was obtained by the following formula. A sample having a fluidity of 3% to 30%, in a case in which phase separation and extrusion did not occur, was determined to have good processability.

Fluidity (%)=(laminate size (one-side length (mm))−100 mm)/100 mm×100

(9) Measurement of Relative Dielectric Constant and Dielectric Loss Tangent

Values at 10 GHz were measured by a cavity resonance method (8722ES-type network analyzer (Agilent Technologies); cavity resonator (Kantoh Electronics Application and Development Inc.)). Samples had a size of 1.8×80 mm. In the case of a laminate, the thickness was adjusted to approximately 0.5 mm. In the case of a resin plate, the thickness was adjusted to 1.5 mm.

(10) Measurement of Peeling Strength of Copper Foil

Peeling adhesion strength was measured by peeling off copper foil (width: 5 mm) on the laminate in a 90° direction at a rate of 50 mm/minute.

(11) Measurement of Glass Transition Temperature (Tg)

Tg was obtained using a viscoelasticity measuring apparatus DVA-200 (DMA, IT Keisoku Seigyo Co., Ltd.). The sample used was a laminate having a size of 2 mm×30 mm×0.5 mm from which copper foil had been removed by etching. The fulcrum span was determined to be 20 mm. The temperature increase rate was determined to be 5° C./minute.

(12) Solvent Resistance

Etching of copper foil on the above prepared laminate was carried out and the laminate was cut into pieces each having a size of 20×20 mm. The thus obtained pieces were used as samples. The samples were immersed in toluene at room temperature for 20 hours, followed by evaluation of the presence or absence of swelling.

(13) Solder Heat Resistance

The samples prepared in (12) were immersed in a solder bath at 260° C. for 20 seconds, followed by evaluation of the presence or absence of swelling.

(14) Measurement of Varnish Viscosity

Varnish viscosity was measured using an E-type viscosity meter under conditions including a sample amount of 1 mL and a measurement temperature of 23° C.

Comparative Examples 1 and 2

The relationship between the molecular weight of a crosslinking component and the varnish viscosity is shown in table 1. The crosslinking component used in Comparative example 1 was high-molecular-weight 1,2-polybutadiene. Thus, it showed a high viscosity of 470 cP in a dilute 11-wt % toluene solution. In addition, with an increased varnish concentration of 21 wt %, polybutadiene was not dissolved, and thus no varnish was obtained.

Examples 1 and 2

The relationship between the molecular weight of a crosslinking component and the varnish viscosity is shown in table 1. The crosslinking component used in Example 1 was low-molecular-weight 1,2-polybutadiene (B3000). Thus, it showed a low viscosity of 18 cP even in a 52-wt % toluene solution. Therefore, a low-molecular-weight crosslinking component was confirmed to be formed into a varnish with good workability.

TABLE 1

| | Varnish viscosity | | | |
|---|---|---|---|---|
| | Example 1 | Example 2 | Comparative example 1 | Comparative example 2 |
| B3000 | 100 | 100 | | |
| RB830 | | | 100 | 100 |
| Low temperature initiator (B) | 4 | 4 | 4 | 4 |
| High temperature initiator (C) | 5 | 5 | 5 | 5 |
| Toluene | 900 | 100 | 900 | 400 |
| Concentration wt % | 11 | 52 | 11 | 21 |
| Viscosity cP | 5 | 18 | 470 | Insoluble |

Comparative Example 3

The relationship between the amount (added) of the low temperature initiator (B) and the processability was mainly examined. Table 2 shows the results. In the case of Comparative example 3 in which the amount of the low temperature initiator (B) added was 1 part by weight, phase separation occurred upon production of a laminate and extrusion of the crosslinking component B3000 was observed. In addition, the amount of B3000 extruded was quite large, and thus it was impossible to measure the fluidity. Further, due to influence of extrusion of the crosslinking component, low levels of glass transition temperature and solvent resistance were obtained.

Examples 3 and 4

In the cases of Examples 3 and 4, the low temperature initiator (B) was contained in amounts of 4 parts by weight and 10 parts by weight, respectively. With the increased amount of the low temperature initiator (B), phase separation and extrusion of the crosslinking component B3000 were prevented. In addition, the fluidity of the resin composition was 5% to 20%. With the increased amount of the low temperature initiator, dielectric properties did not deteriorate, and thus good results were obtained. In both examples, the temperature dependency of elastic modulus was small, and thus the glass transition temperature was not clearly observed. Also, swelling of a laminate in toluene was not observed. Thus, good solder heat resistance was obtained.

Comparative Example 4

In the case of Comparative example 4, the low temperature initiator (B) was contained in an amount of 15 parts by weight. With the increased amount of the low temperature initiator (B), phase separation and extrusion of the crosslinking component B3000 were prevented. However, the fluidity became 0% so that processability deteriorated.

Example 5

The relationship between the styrene content of the component (D) and the glass transition temperature (styrene-butadiene block copolymer) is shown in table 3. In the case of Example 3, H1031 with a styrene content of 30 wt % was contained and no glass transition temperature was observed. In the case of Example 5 in which H1051 with a styrene content of 42 wt % was contained, a glass transition temperature of 100° C. was observed.

TABLE 3

Styrene contents in styrene-butadiene block copolymer

|  |  | Example 3 | Example 5 |
|---|---|---|---|
| Component A | B3000 | 100 | 100 |
| Component B | BPO | 4 | 4 |
| Component C | 25B | 7 | 7 |
| Component D | H1031 | 43 | 0 |
| Component D | H1051 | 0 | 43 |
| Component E | SAYTEX8010 | 50 | 50 |
| Component F | SO25R | 90 | 90 |
| Occurrence of phase separation | | None | None |
| Occurrence of extrusion of B3000 | | None | None |
| Resin composition fluidity (%) | | 20 | 10 |
| Comprehensive evaluation of prepreg processability | | ○ | ○ |
| Tack-free properties of prepreg | | Present | Present |
| ε': resin plate | 10 GHz | 2.5 | 2.5 |
| tan δ: resin plate | 10 GHz | 0.0015 | 0.0015 |
| ε': laminate | 10 GHz | 3.3 | 3.3 |
| tan δ: laminate | 10 GHz | 0.0024 | 0.0024 |
| Glass transition temperature ° C. | | None | 100 |
| Solvent resistance | | ○ | ○ |
| Solder heat resistance (260° C.) | | ○ | ○ |

Comparative Example 5

The content of the component (C) (high temperature initiator) was examined. Table 4 shows the results. In the case of Comparative example 5, the content of the component (C) (high temperature initiator) was 3 parts by weight. In such

TABLE 2

Amounts of the low temperature initiator (B) added

|  |  | Comparative example 3 | Example 3 | Example 4 | Comparative example 4 |
|---|---|---|---|---|---|
| Component A | B3000 | 100 | 100 | 100 | 100 |
| Component B | BPO | 1 | 4 | 10 | 15 |
| Component C | 25B | 7 | 7 | 7 | 7 |
| Component D | H1031 | 43 | 43 | 43 | 43 |
| Component D | H1051 | 0 | 0 | 0 | 0 |
| Component E | SAYTEX8010 | 50 | 50 | 50 | 50 |
| Component F | SO25R | 90 | 90 | 90 | 90 |
| Occurrence of phase separation | | Observed | None | None | None |
| Occurrence of extrusion of B3000 | | Observed | None | None | None |
| Resin composition fluidity (%) | | — | 20 | 5 | 0 |
| Comprehensive evaluation of prepreg processability | | X | ○ | ○ | X |
| Tack-free properties of prepreg | | Absent | Present | Present | Present |
| ε': resin plate | 10 GHz | 2.5 | 2.5 | 2.5 | 2.5 |
| tan δ: resin plate | 10 GHz | 0.0015 | 0.0015 | 0.0016 | 0.0016 |
| ε': laminate | 10 GHz | 3.4 | 3.3 | 3.2 | 3.2 |
| tan δ: laminate | 10 GHz | 0.0025 | 0.0024 | 0.0024 | 0.0025 |
| Glass transition temperature | ° C. | 50 | None | None | None |
| Solvent resistance | | X | ○ | ○ | ○ |
| Solder heat resistance (260° C.) | | ○ | ○ | ○ | ○ | case, excellent processability, dielectric properties, and peeling strength were obtained; however, the level of solvent resistance was low.

Examples 6 and 7

In the cases of Examples 6 and 7, a high temperature initiator (C) component was contained in amounts of 5 parts by weight and 15 parts by weight, respectively. In both cases, excellent processability, dielectric properties, and solvent resistance were obtained. With the increased amount of the component (C) (high temperature initiator), peeling strength decreased. However, within the scope of the examination of the above Examples, good peeling strength was observed.

TABLE 4

Amounts of the high temperature initiator (C.) added

| | | Comparative example 5 | Example 6 | Example 3 | Comparative example 7 |
|---|---|---|---|---|---|
| Component A | B3000 | 100 | 100 | 100 | 100 |
| Component B | BPO | 4 | 4 | 4 | 4 |
| Component C | 25B | 3 | 5 | 7 | 15 |
| Component D | H1031 | 43 | 43 | 43 | 43 |
| Component E | SAYTEX8010 | 50 | 50 | 50 | 50 |
| Component F | SO25R | 90 | 90 | 90 | 90 |
| Occurrence of phase separation | | None | None | None | None |
| Occurrence of extrusion of B3000 | | None | None | None | None |
| Resin composition fluidity (%) | | 20 | 20 | 20 | 20 |
| Comprehensive evaluation of prepreg processability | | ○ | ○ | ○ | ○ |
| Tack-free properties of prepreg | | Present | Present | Present | Present |
| $\epsilon'$: resin plate | 10 GHz | 2.5 | 2.5 | 2.5 | 2.6 |
| tan $\delta$: resin plate | 10 GHz | 0.0015 | 0.0015 | 0.0015 | 0.0016 |
| $\epsilon'$: laminate | 10 GHz | 3.3 | 3.3 | 3.3 | 3.3 |
| tan $\delta$: laminate | 10 GHz | 0.0025 | 0.0024 | 0.0024 | 0.0024 |
| Glass transition temperature | ° C. | 50 | 150 | None | None |
| Solvent resistance | | x | ○ | ○ | ○ |
| Solder heat resistance (260° C.) | | ○ | ○ | ○ | ○ |
| Peeling strength | kN/m | 0.9 | 0.8 | 0.7 | 0.6 |

Example 8

A multilayer printed wiring board was produced as described below with the use of a double-faced copper-clad laminate and a prepreg used in Example 6.

(A) Photoresist (HS425, Hitachi Chemical Co., Ltd.) was laminated on one surface of a double-faced copper-clad laminate, followed by exposure across the laminated surface. Next, photoresist (HS425, Hitachi Chemical Co., Ltd.) was laminated on the other copper surface, followed by exposure in a test pattern. Then, photoresist on unexposed parts was developed with the use of a 1% sodium carbonate solution.

(B) Exposed copper foil was removed by etching with the use of an etching solution containing sulfuric acid (5%) and hydrogen peroxide (5%). Thus, conductor wiring formation was carried out on one face of the double-faced copper-clad laminate.

(C) Remaining photoresist was removed using a 3% sodium hydroxide solution such that a wiring board, one face of which was subjected to wiring formation, was obtained. In the same manner, two wiring boards were prepared.

(D) The wiring faces of the two wiring boards were applied to each other. Then, a prepreg was inserted therebetween. The obtained product was subjected to heating and pressurization in vacuo so as to be multilayered. Heating was carried out under conditions of 230° C. for 60 minutes. The pressing pressure was 2 MPa.

(E) Photoresist (HS425, Hitachi Chemical Co., Ltd.) was laminated on exterior copper on both faces of the prepared multilayered board, followed by exposure in a test pattern. Then, photoresist on unexposed parts was developed with the use of a 1% sodium carbonate solution.

(F) Exposed copper foil was removed by etching with the use of an etching solution containing sulfuric acid (5%) and hydrogen peroxide (5%). Remaining photoresist was removed using a 3% sodium hydroxide solution such that exterior wiring formation was carried out.

(G) Through holes were formed by drilling for connection of inner layer wires and exterior wires.

(H) The obtained wiring board was immersed in a colloidal solution containing a plating catalyst such that the catalyst was provided inside through holes and on the surfaces of the board.

(I) After activation treatment of the plating catalyst, a seed layer having a thickness of approximately 1 μm was formed by electroless plating (CUST2000, Hitachi Chemical Co., Ltd.).

(J) Photoresist (HN920, Hitachi Chemical Co., Ltd.) was laminated on both faces of the wiring board.

(K) Through hole portions and edge portions of the wiring board were masked, followed by exposure. Then, development was carried out using a 3% sodium carbonate such that openings were provided.

(L) Electrodes were provided at edge portions of the wiring board. Electrolytic plating was carried out on through hole portions in a manner such that a copper plating thickness of approximately 18 μm was obtained.

(M) The electrode portions were removed by cutting. Remaining photoresist was removed using a 5% sodium hydroxide aqueous solution.

(N) The wiring board was immersed in an etching solution containing sulfuric acid (5%) and hydrogen peroxide (5%) for etching of approximately 1 μm such that the seed layer was removed. Thus, a multilayer wiring board was produced. In the case of the multilayer wiring board, disconnection or peeling off of wires did not occur upon multilayer formation. Also, the relative dielectric constant and the dielectric loss tangent of the insulating material are low. Thus, the multilayer board is applicable to formation of a circuit of a high-frequency apparatus.

What is claimed is:

1. A polybutadiene resin composition, comprising: a crosslinking component (A) comprising repeating units represented by the following formula (1) and having a number average molecular weight of 1000 to 20000; a radical polymerization initiator (B), the one-minute half-life temperature of which is 80° C. to 140° C.; and a radical polymerization initiator (C), the one-minute half-life temperature of which is 170° C. to 230° C.; wherein 3 to 10 parts by weight of the component (B) and 5 to 15 parts by weight of the component (C) are contained relative to 100 parts by weight of the component (A):

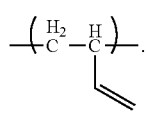

formula (1)

2. The polybutadiene resin composition according to claim 1, wherein the first exothermic peak is at 80° C. to 140° C. and the second exothermic peak is at 170° C. to 230° C. during thermal polymerization.

3. The polybutadiene resin composition according to claim 1, wherein the component (C) is 2,5-dimethyl-2,5-bis(t-butylperoxy)hexyne-3.

4. The polybutadiene resin composition according to claim 1, further comprising a styrene-butadiene block copolymer or a hydrogenated styrene-butadiene block copolymer (D), a flame retardant (E), and inorganic filler (F).

5. The polybutadiene resin composition according to claim 4, wherein the content of repeating units represented by formula (1) in the component (A) is 90 wt % or more, the styrene residue content in the component (D) is 10 to 30 wt %, the component (E) is a compound represented by formula (2) or (3), and the component (F) is a silicon oxide filler subjected to surface treatment with a coupling agent capable of reacting with vinyl groups:

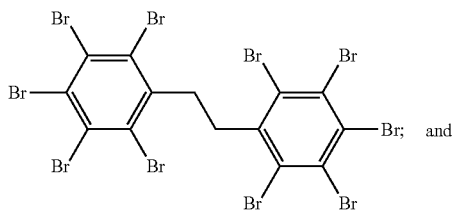

formula (2)

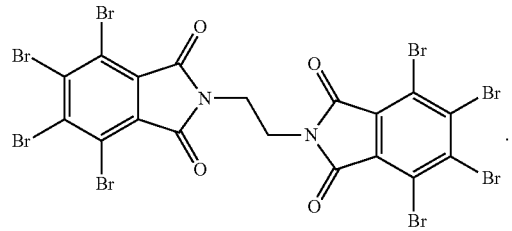

formula (3)

6. The polybutadiene composition according to claim 4, wherein 15 to 100 parts by weight of the component (D), 50 to 100 parts by weight of the component (E), and 80 to 200 parts by weight of the component (F) are contained relative to 100 parts by weight of the component (A).

7. The polybutadiene resin composition according to claim 1, which is a polybutadiene resin composition obtained by terminating a thermal polymerization reaction initiated by the component (B).

8. A method for producing a prepreg, comprising impregnating a cloth or nonwoven cloth made of organic or inorganic material with the polybutadiene resin composition according to claim 1 and then carrying out drying by heat at a temperature in the range of the first exothermic peak temperature of thermal polymerization of the polybutadiene resin composition ±10° C.

9. A prepreg, which is obtained by impregnating a cloth or nonwoven cloth made of organic or inorganic material with the polybutadiene resin composition according to claim 1 and then carrying out drying by heat at a temperature in the range of the first exothermic peak temperature of thermal polymerization of the polybutadiene resin composition ±10° C.

10. A laminate, which is produced by overlapping conductive foil with the prepreg according to claim 9, curing the prepreg by pressurization and heating, and bonding the cured prepreg with the conductive foil.

11. A multilayer printed wiring board, which is produced by laminate bonding a plurality of printed wiring boards via the prepreg according to claim 9 and then carrying out interlayer wire formation,
wherein the printed wiring boards are formed by wiring processing conductive foil disposed on a surface of a laminate, and
wherein the laminate is produced by overlapping the conductive foil with said prepreg, curing said prepreg by pressurization and heating, and bonding the cured prepreg to the conductive foil.

* * * * *